United States Patent [19]

Goldman

[11] 4,259,421
[45] Mar. 31, 1981

[54] IMPROVING ETCH-RESISTANCE OF CASEIN-BASED PHOTORESIST PATTERN

[75] Inventor: Abraham Goldman, Kendall Park, N.J.

[73] Assignee: RCA Corporation, New York, N.Y.

[21] Appl. No.: 45,117

[22] Filed: Jun. 4, 1979

[51] Int. Cl.³ .............................................. G03C 5/00
[52] U.S. Cl. .................................... 430/5; 156/659.1; 430/313; 430/318; 430/323; 430/331; 427/96; 427/338; 106/138; 264/129
[58] Field of Search ............... 430/270, 323, 331, 357, 430/374, 313, 318, 292, 293.5; 156/659, 673

[56] References Cited

U.S. PATENT DOCUMENTS

| | | | |
|---|---|---|---|
| 2,908,667 | 10/1959 | Williams | 430/331 X |
| 3,157,501 | 11/1964 | Burrows et al. | 430/331 X |
| 3,698,902 | 10/1972 | Gaspar | 430/331 X |
| 4,061,529 | 12/1977 | Goldman et al. | 156/644 |
| 4,158,566 | 6/1979 | Goldman | 430/318 |

*Primary Examiner*—Edward C. Kimlin
*Attorney, Agent, or Firm*—Birgit E. Morris; Howard F. VanDenburgh

[57] ABSTRACT

The etch resistance of a casein-based photoresist pattern to low specific gravity ferric chloride-based etchant solutions is increased by treating the photoresist pattern with a methylene blue solution, containing at least 0.1 weight percent methylene blue, prior to exposure to the etchant solution.

12 Claims, No Drawings

IMPROVING ETCH-RESISTANCE OF CASEIN-BASED PHOTORESIST PATTERN

This invention relates to the etch resistance of a water-based photoresist. More particularly, the invention pertains to a method of improving the etch resistance of a photoresist pattern, prepared from an aqueous casein-based photoresist solution.

BACKGROUND OF THE INVENTION

Photosensitive etch resistant films based on aqueous solutions of natural products such as fish glue, albumin, and casein have been known for a number of years. One such useful photoresist composition comprises water, casein, made by acid precipitation of milk, an alkali metal base to impart a pH of 7.7 or higher which improves the solubility of the natural product in the water, and an ammonium dichromate sensitizer. Goldman and Datta in their U.S. Pat. No. 4,061,529 disclose the addition of sodium borate as the base in a concentration such that the photoresist solution has the final pH of 6.7 to 7.3, to improve the pot life of the coating composition and the shelf life of coated substrates.

These resists have been employed extensively in the lithographic printing arts and in the manufacture of shadow masks for television monitors. A cleaned metal, e.g., copper, surface or substrate is coated with the aqueous photoresist solution and dried. A mask having the desired pattern is contacted to the resist and exposed to light of an appropriate wavelength which hardens the resist in the exposed areas. The resist film is then washed with water to dissolve the unexposed resist and thereby uncover part of the metal surface. The now partially coated substrate is then dried and baked for about 5 minutes at a temperature of from about 260°-287° C. This step is required to render the remaining photoresist etch resistant. The partially coated substrate is then etched by spraying with hot ferric chloride solution, which etches away the bared metal portions. The residual resist can then be removed by hot alkali solution.

The above process has certain limitations which restrict its use in other high production manufacture which employ lithographic techniques; in particular, in the manufacture of printed circuit boards wherein a copper-clad substrate, such as a phenolic impregnated paperboard, is etched to form a pattern of conductors to which various components are soldered. Generally, these printed circuit boards are made by screen printing an etch resistant ink onto the boards and etching the exposed metal areas. However, this method is not able to define line widths and spacings sufficiently small as is now demanded by the increasing miniaturization of components on printed circuit boards. Photolithographic techniques to define such fine pattern spacings must then be employed if high yields are to be obtained.

The pattern is made by applying a photoresist film over the copper layer, exposing and developing the resist to create a pattern of photoresist and exposed copper. The copper is etched away in the exposed areas, and the photoresist is removed, leaving a patterned copper layer on the board. At present, organic-based photoresists are used because the high temperatures required to cure water-based resists cannot be tolerated by the phenolic impregnated paper substrate.

One attempted method to deal with this high temperature curing problem of the water-based photoresist is disclosed by Goldman in U.S. Application Ser. No. 877,481, filed Feb. 13, 1978, now U.S. Pat. No. 4,158,566, wherein it is disclosed to use an accelerator with such water-based photoresist compositions. As an accelerator there is disclosed N-methylol acrylamide which, when added to a casein-based photoresist composition, lowers the curing temperature required to make the photoresist etch resistant to a temperature of about 125°-135° C., and enables such compositions to be employed in printed circuit board manufacture.

Another method dealing with the etch resistance of water-based photoresists is disclosed by Dougherty in U.S. Application Ser. No. 967,793, filed Dec. 8, 1978, herein incorporated by reference, wherein it is disclosed that such photoresists are etch resistant or sufficiently etch resistant to allow the use of the same in the manufacture of printed circuit boards if certain process parameters are maintained. These parameters include the use of a minimum thickness (4.0 micrometers or above) of photoresist film, the use of a specific type (low hardness content) of water in developing the patterned photoresist, and the use of an etchant solution having a certain minimum specific gravity (1.34 or above).

There is a continuing need for improved etch resistance in water-based photoresists such that etchant solutions of lower specific gravity may be used. Lower specific gravity etchant solutions make possible increases in etch rates. This, then, increases the overall throughput in the manufacturing process, be it printed circuit boards or television shadow masks.

SUMMARY OF THE INVENTION

I have now found that if a casein-based photoresist pattern is treated with a dye solution which further cures the casein, particularly a methylene blue solution, prior to exposure to the etchant solution, its etch resistance is improved such that lower specific gravity, specifically below 1.40, ferric chloride-based etchant solutions can be used in etching the metal surface or substrate containing the casein-based photoresist.

DETAILED DESCRIPTION OF THE INVENTION

The invention includes the method of producing a casein-based photoresist pattern of improved etch resistance to low specific gravity (specifically below 1.40) ferric chloride-based etchant solutions, and comprises treating an exposed, developed and dried casein-based photoresist pattern with a dye solution which further cures the casein, particularly a methylene blue solution, prior to exposure to the etchant solution. The methylene blue solution should contain at least 0.1 percent methylene blue by weight. Other dye solutions which further cure the casein or act in a similar manner as the methylene blue solution are contemplated by, may be used in and are included in this invention.

More completely, the method may be carried out by applying a casein-based photoresist solution to a substrate surface, drying the photoresist solution on the substrate to form a photoresist film, exposing the dried photoresist film to actinic radiation, such as through a photomask, developing the exposed photoresist film to leave a photoresist pattern on the substrate surface, treating the photoresist pattern with a dye solution which further cures the casein, particularly a methylene blue solution, and thereafter air drying the substrate to produce a photoresist pattern of improved etch resistance. The process may also include the further steps of etching the patterned substrate with a ferric chloride-based etchant solution having a low specific gravity (specifically below 1.40) to etch those portions of the substrate surface not protected by the photoresist pattern, and stripping the remaining photoresist from the substrate in a hot alkali solution to leave a patterned surface layer on the substrate.

The aqueous casein solutions used in the process of this invention comprise casein as the sensitizable protein material, sodium borate as the alkalizing agent for the casein, alkali dichromate photosensitizer for the casein, and water. Optionally, small amounts of a surfactant and a dye may also be added, if desired. In addition to these ingredients, these solutions may also contain the accelerator N-methylol acrylamide, which may be employed in amounts of from about 3 up to about 30 percent by weight of the casein present in the solution. The casein employed may be any acid precipitated casein and usually comprises from about 6 to about 12 percent by weight of the photoresist composition.

The alkalizing agent is added to solubilize the casein and is added in sufficient amount such that the pH of the final photoresist solution is from about 6.7 to about 7.3. Sodium borate is the preferred alkalizing agent in that it does not degrade the casein. Generally, amounts of from about 8 to about 20 percent by weight of the casein are sufficient, but additional amounts may be required to bring the pH to the desired level.

Sodium dichromate is the preferred alkali dichromate photosensitizer as it reduces dark hardening in the casein photoresist. However, other dichromates, such as ammonium and potassium dichromate, may also be employed. The sensitizer is usually added in amounts of from about 2 to about 20 weight percent of the casein present. The amount of water added to the solution is adjusted to regulate the viscosity and the thickness of the resultant photoresist coating.

These aqueous solutions can be prepared by heating deionized water to about 50°-60° C. and dissolving the sodium borate and surfactant. The casein is then added in a small but steady stream with vigorous agitation until dissolved; usually about 30 to 40 minutes is sufficient. The resultant solution is then cooled to room temperature and filtered. Just prior to use, the dichromate sensitizer is added and the pH is adjusted, if required, with sodium borate. If used, the N-methylol acrylamide is now added.

The aqueous solutions used in the present method can be applied to the substrate by dipping, spin coating, roller coating, and the like. The thickness of the coated photoresist film is usually maintained in the range of from about 2 to about 7 micrometers, and preferably about 4-5 micrometers. Application of the aqueous solution may be repeated to obtain the desired thickness of the coating.

After the photoresist coating has been applied to the substrate, the same is dried, usually employing a source of infrared light. Thereafter, the photoresist is exposed to an ultraviolet light source, such as a carbon arc, xenon, or a mercury lamp through a photomask, which exposure hardens the coating in the exposed areas. The exposed photoresist is then developed by flushing with water, which removes the unexposed portions of the resist, leaving the desired pattern of photoresist film on the substrate. After being developed the substrate with the photoresist pattern is, according to the invention, treated with a methylene blue solution to improve the etch resistance of the photoresist pattern. The methylene blue solution is preferably one which contains from about 0.1 to about 2.0 percent methylene blue by weight. The treatment or exposure of the photoresist pattern to the methylene blue solution is one which is carried out for a period of approximately 10 sec. and preferably in the range of from about 5 to about 20 sec. Thereafter, the substrate and photoresist pattern is air dried.

The process of the invention may be further carried out by etching the exposed portions of the metal surface or substrate with a ferric chloride-based etchant solution having a low specific gravity to etch away those portions of the substrate or substrate surface not protected by the patterned etch resistant coating. The preferred etchant for use in the method of the invention will have a specific gravity below 1.40, and more preferably between about 1.36 and 1.38. Following etching, the remaining photoresist on the substrate may be removed by a warm, dilute basic solution, e.g., aqueous 2 to 10 percent by weight sodium hydroxide at 50°-80° C., to leave a patterned metal surface on the substrate.

In order to illustrate the invention and the improved process thereof with greater particularity, the following specific examples are included. These examples are intended to illustrate the invention only and are not intended to limit the same in any way.

EXAMPLE I

A circuit board having a copper-clad substrate was pretreated to clean the metal surface thereof by the use of a physical abrasion process. Coincidental with this cleaning an aqueous-based photoresist solution was prepared as set forth above, using deionized water and casein as the sensitizable material in an amount of about 10 percent by weight of the resultant photoresist composition. Additionally added to the solution were sodium borate alkalizing agent in an amount of about 1.3 weight percent, sodium dichromate photosensitizer in the amount of about 0.3 weight percent, and a surfactant in the amount of about 0.1 weight percent. This solution was coated onto the copper surface of the circuit board by the spin-coating technique. The resultant photoresist film having a thickness of about 2 micrometers was air dried at room temperature. The dried photoresist coating was then exposed through a photomask for about 50 seconds to a 2,000 watt, xenon pulse lamp, thereafter developed with a water spray, and finally once again dried to leave a pattern of photoresist on the circuit board.

The circuit board with photoresist pattern thereon was next sprayed with a 0.1 percent by weight solution of methylene blue and then air dried. After the methylene blue treatment, the etching of the circuit board was carried out with a ferric chloride-based etchant solution having a specific gravity of approximately 1.38 at a temperature of about 53° C. for a period of 1 minute. During etching it was noted that the photoresist pattern was hydrophobic, did not swell upon wetting, did not show any signs of breakdown or failure in the low specific gravity etchant solution, and did not show any sign of peeling upon drying of the board. After etching, the remaining photoresist coating on the board was stripped with warm, dilute sodium hydroxide leaving a patterned copper layer on the circuit board.

CONTROL I

Another circuit board was prepared, coated, exposed, and developed as set forth above in Example I, but was not treated with the methylene blue solution as was done in Example I. Thereafter, it was attempted to etch the exposed copper surface of the board of this Example in the low specific gravity ferric chloride-based etchant solution of Example I; however, the photoresist pattern on the circuit board failed, in that it became hydrophilic and swelled (etchant penetration) when wet, and subsequently peeled from the circuit board upon drying.

EXAMPLE II

In this Example a circuit board was prepared, coated, exposed, developed, treated with methylene blue solution and etched as in Example I, with the single exception that the exposure time under the xenon lamp was decreased to 40 seconds. The etch resistance of the photoresist pattern during etching was increased by the methylene blue solution treatment, as results similar to those observed in Example I were also observed with the photoresist pattern of this Example.

CONTROL II

An additional circuit board was prepared, coated, exposed, and developed as set forth above in Example II, but was not treated with the methylene blue solution as was done in Example II. Thereafter, it was attempted to etch the exposed copper surface of the board of this Example in the low specific gravity ferric chloride-based etchant solution of Example I; however, the photoresist pattern on the circuit board failed, in that it became hydrophilic and swelled (etchant penetration) when wet, and subsequently peeled from the circuit board upon drying.

EXAMPLE III

A further circuit board was prepared, coated, exposed, developed, treated, and etched identical to that of Example I with the exception that the exposure time to the xenon lamp was reduced to 30 seconds and the etching was carried out for a period of 1.5 minutes (150 percent of previous residence time). It was observed in this Example that the etch resistance of the photoresist pattern during etching was enhanced by the methylene blue solution treatment, as the photoresist pattern gave similar results in the lower specific gravity ferric chloride-based etchant solution as was observed with the photoresist pattern of Example I.

Another advantage of the methylene blue solution treatment to enhance the etch resistance of the photoresist pattern over other methods is that the same is non-toxic and safe for use in the work environment. Additionally, methylene blue solution has a color and when sprayed onto a photoresist pattern makes small defects therein, such as pinholes, more readily visible to the human eye, thereby aiding in the quality control of the total manufacturing process.

I claim:

1. A method of improving the etch resistance of a casein-based photoresist pattern to a low specific gravity ferric chloride-based etchant solution, comprising, treating a dried casein-based photoresist pattern with a methylene blue dye solution which further cures the casein to thereby enhance its etch resistance, and contacting said photoresist pattern with a ferric chloride-based etchant solution having a specific gravity below about 1.40.

2. The method as set forth in claim 1 wherein said etchant solution has a specific gravity of between about 1.36 and about 1.38.

3. The method as set forth in claim 1 including the further step of stripping the remaining photoresist pattern by treating with a hot alkali solution.

4. The method as set forth in claim 1 wherein said methylene blue solution contains from about 0.1 to about 2.0 percent methylene blue by weight.

5. The method as set forth in claim 1 wherein said photoresist pattern is produced from a solution including acid precipitated casein, alkali dichromate photosensitizer for said casein, sodium borate as alkalizing agent, and water.

6. In a method of producing a photoresist pattern of improved etch resistance on a substrate, including the steps of:
   (a) applying a casein-based photoresist solution to a substrate;
   (b) drying said photoresist solution on said substrate to form a photoresist film;
   (c) exposing said dried photoresist film to actinic radiation through a photomask;
   (d) developing said exposed photoresist film to thereby leave a pattern of photoresist film on said substrate; the improvement comprising the additional step of
   (e) treating said photoresist pattern with a methylene blue dye solution which further cures the casein to improve its etch resistance and, etching said patterned substrate with a ferric chloride-based etchant solution having a specific gravity below about 1.40.

7. The method as set forth in claim 6 wherein said etchant solution has a specific gravity of between about 1.36 and about 1.38.

8. The method as set forth in claim 6 including the further step of stripping the residual photoresist film from said substrate in a hot alkali solution.

9. The method as set forth in claim 6 wherein said methylene blue solution contains from about 0.1 to about 2.0 percent methylene blue by weight.

10. The method as set forth in claim 6 wherein said casein-based solution includes acid precipitated casein, alkali dichromate photosensitizer for said casein, sodium borate as alkalizing agent, and water.

11. The method as set forth in claim 6 wherein said substrate is a circuit board.

12. The method as set forth in claim 6 wherein said substrate is a television shadow mask.

* * * * *